United States Patent
Hasunuma et al.

(10) Patent No.: US 7,095,124 B2
(45) Date of Patent: Aug. 22, 2006

(54) SEMICONDUCTOR DEVICE

(75) Inventors: Masahiko Hasunuma, Yokohama (JP);
Akitsugu Hatazaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/975,071

(22) Filed: Oct. 28, 2004

(65) Prior Publication Data
US 2005/0121808 A1 Jun. 9, 2005

(30) Foreign Application Priority Data
Oct. 29, 2003 (JP) .............................. 2003-369286

(51) Int. Cl.
*H01L 23/28* (2006.01)
(52) U.S. Cl. .................. 257/787; 257/791; 257/792; 257/793; 257/794; 257/750
(58) Field of Classification Search ................ 257/750, 257/751, 758, 787, 791, 792, 793, 794
See application file for complete search history.

(56) References Cited

U.S. PATENT DOCUMENTS

| | | | | |
|---|---|---|---|---|
| 6,147,374 A | * | 11/2000 | Tanaka et al. | .............. 257/787 |
| 6,166,433 A | * | 12/2000 | Takashima et al. | ......... 257/702 |
| 6,265,784 B1 | | 7/2001 | Kawano et al. | |
| 6,448,665 B1 | | 9/2002 | Nakazawa et al. | |
| 6,512,176 B1 | * | 1/2003 | Yaguchi et al. | ............. 174/52.4 |
| 6,847,125 B1 | * | 1/2005 | Tanaka et al. | .............. 257/787 |

FOREIGN PATENT DOCUMENTS

| | | |
|---|---|---|
| JP | 9-246464 | 9/1997 |
| JP | 10-321769 | 12/1998 |
| JP | 2000-11424 | * 4/2000 |
| JP | 2002-141436 | 5/2002 |

OTHER PUBLICATIONS

Notification of Reasons for Rejection (Japanese Office Action), Oct. 25, 2005, for Japanese Patent Application No. 2003-369286.

* cited by examiner

*Primary Examiner*—Jasmine Clark
(74) *Attorney, Agent, or Firm*—Finnegan, Henderson, Farabow, Garrett & Dunner, L.L.P.

(57) ABSTRACT

A semiconductor device comprises a semiconductor chip in which a multilayer interconnection structure having an interlayer insulation film with a low relative dielectric constant is formed on a silicon substrate and a sealing resin layer which coats the semiconductor chip. The sealing resin layer meets, in coefficient of linear expansion ($\alpha$) at room temperature, Young's modulus (E) at room temperature and thickness (h) thereof, a relationship of the following formula (1)

$$E < 0.891/\{(\alpha-\alpha s)^2 \times h\} \quad (1)$$

where
E represents the Young's modulus (GPa) of the sealing resin at room temperature;
$\alpha$ represents the coefficient of linear expansion (ppm) of the sealing resin at room temperature;
$\alpha s$ represents the coefficient of linear expansion (3.5 ppm) of the silicon substrate; and
h represents the thickness (m) of the sealing resin on the device-formed surface of the semiconductor chip.

17 Claims, 5 Drawing Sheets

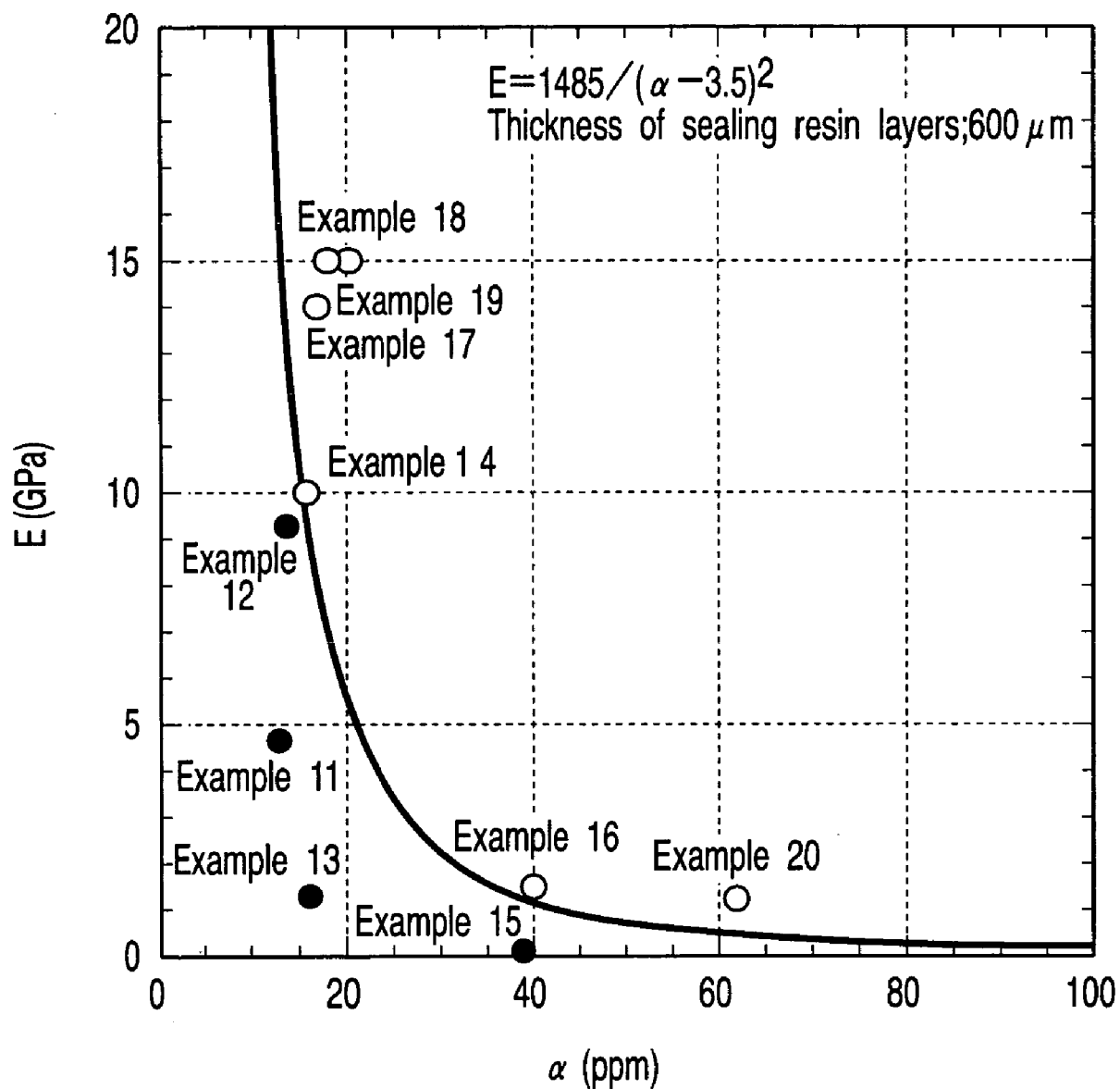
F I G. 5

SEMICONDUCTOR DEVICE

CROSS-REFERENCE TO RELATED APPLICATIONS

This application is based upon and claims the benefit of priority from prior Japanese Patent Application No. 2003-369286, filed Oct. 29, 2003, the entire contents of which are incorporated herein by reference.

BACKGROUND OF THE INVENTION

1. Field of the Invention

This invention relates to a semiconductor device having a semiconductor chip coated with a sealing resin layer.

2. Description of the Related Art

Recently, the wiring electrical resistance has been reduced and a relative dielectric constant of an interlayer insulation film have been made smaller for the purpose of acceleration of a semiconductor device such as an LSI. Specifically, the wiring material has been shifted from aluminum (Al) to copper (Cu). As for the interlayer insulation film, too, a low relative dielectric constant insulation film (low-k film) such as a silicon oxide film doped with-fluorine or a silicon oxide film containing organic components has been adopted together with a simple silicon oxide film.

The interlayer insulation film with low relative dielectric constant is formed by lowering the density of the material or excluding the dielectric polarization of the material. To lower the density of the material, for example, the material is generally made porous. Since the interlayer insulation film with low relative dielectric constant is low in film density, its mechanical properties such as the Young's modulus are generally small. In other words, the material of the interlayer insulation film with low relative dielectric constant is low in strength. Furthermore, the interlayer insulation film with low relative dielectric constant has a film structure of low polarity to lower the dielectric constant in the film. For this reason, if the interlayer insulation films with low relative dielectric constant or the interlayer insulation film and the other interlayer insulation film are laminated, adhesion strength in the interface between the laminated films is low.

Such a low strength in the interlayer insulation film with low relative dielectric constant and such a low adhesion strength in the interface between the interlayer insulation films in the laminated structure including the interlayer insulation films with low relative dielectric constant, particularly become serious troubles in the lamination process to form the wiring of the semiconductor device in the multilayer structure. They also cause serious problems such as peeling and the like in a packaging process executed after the lamination process. In particular, the factor bringing about a serious damage is thermal stress from a sealing resin layer which serves as an environmental protection film. The sealing resin layer is generally smaller in Young's modulus by one or more digits and greater in coefficient of linear expansion by one or more digits, than that of silicon substrate. For this reason, great thermal stress is applied to the interlayer insulation film, in various kinds of processings that make thermal influence, such as curing the resin in a resin sealing step, reflowing the solder during mounting of the semiconductor device on the printed wiring board or the like, TCT (Temperature Cycling Test), and the like. As a result, the thermal stress breaks the interlayer insulation film with low relative dielectric constant such as a low-k film which has low polarity and low mechanical strength, and causes peeling in the interface. A prompt solution is therefore demanded to solve the problem.

On the other hand, Jpn. Pat. Appln. KOKAI Publication No. 9-246464 discloses a semiconductor device in which a side surface of an LSI chip or an overall surface thereof other than a bonding pad is coated with insulating resin and sealed by a sealing resin layer to reduce an external force which is to be applied directly to the side surface or entire surface of the LSI chip together with the curing and shrinking force of the sealing resin and the thermal stress of the sealing resin. The publication also discloses that the insulating resin includes resins such as epoxy, acryl, polyimide, urethane and the like that are cured by heat treatment, exposure to ultraviolet radiation, room-temperature maintenance and the like. In addition, the publication also discloses that the Young's modulus of the insulating resin should be smaller than that of the sealing resin.

In the invention of Jpn. Pat. Appln. KOKAI Publication No. 9-246464, however, since the insulating resin needs to be used as well as the sealing resin, the structure of the semiconductor device becomes complicated and interfaces considered as the peeling factor are newly increased problems, which increases the manufacturing costs.

BRIEF SUMMARY OF THE INVENTION

According to a first aspect of the present invention, there is provided a semiconductor device comprising:

a semiconductor chip in which a multilayer interconnection structure having an interlayer insulation film with a low relative dielectric constant is formed on a silicon substrate; and a sealing resin layer which coats the semiconductor chip, wherein the sealing resin layer meets, in coefficient of linear expansion ($\alpha$) at room temperature, Young's modulus (E) at room temperature and thickness (h) thereof, a relationship of the following formula (1)

$$E < 0.891 / \{(\alpha - \alpha s)^2 \times h\} \qquad (1)$$

where

E represents the Young's modulus (GPa) of the sealing resin at room temperature, $\alpha$ represents the coefficient of linear expansion (ppm) of the sealing resin at room temperature;

$\alpha s$ represents the coefficient of linear expansion (3.5 ppm) of the silicon substrate; and h represents the thickness (m) of the sealing resin on a device-formed surface of the semiconductor chip.

According to a second aspect of the present invention, there is provided a semiconductor assembly comprising:

a wiring board;

a semiconductor chip which is mounted on the wiring board and in which a multilayer interconnection structure including an interlayer insulation film with low relative dielectric constant is formed on a silicon substrate; and a sealing resin layer which covers at least a device-formed surface of the semiconductor chip, wherein, the sealing resin layer meets, in coefficient of linear expansion ($\alpha$) at room temperature, Young's modulus (E) at room temperature and thickness (h) thereof, a relationship of the following formula (1)

$$E < 0.891 / \{(\alpha - \alpha s)^2 \times h\} \qquad (1)$$

where

E represents the Young's modulus (GPa) of the sealing resin at room temperature;

α represents the coefficient of linear expansion (ppm) of the sealing resin at room temperature;

αs represents the coefficient of linear expansion (3.5 ppm) of the silicon substrate; and h represents the thickness (m) of the sealing resin on the device-formed surface of the semiconductor chip.

BRIEF DESCRIPTION OF THE SEVERAL VIEWS OF THE DRAWING

FIG. 5 shows a graph indicating peeling of a low-k film after TCT, in E-BGA packages of examples 11 to 20.

DETAILED DESCRIPTION OF THE INVENTION

Figure 1:
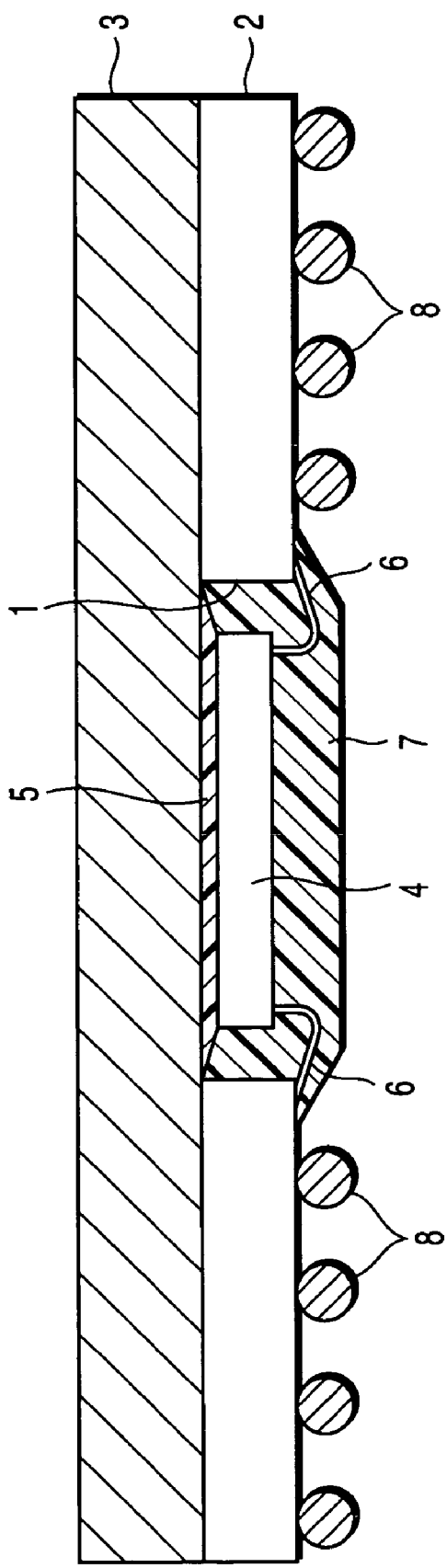
FIG. 1 shows a cross-sectional-view of an E-BGA package according to an embodiment of the present invention.

An embodiment of the present invention will be explained below with reference to the accompanying drawings.

A semiconductor device of this embodiment comprises a semiconductor chip in which a multilayer interconnection structure having an interlayer insulation film (low-k film) with a low relative dielectric constant is formed on a silicon substrate and a sealing resin layer which coats the semiconductor chip. The sealing resin layer meets, in coefficient of linear expansion (α) at room temperature, Young's modulus (E) at room temperature and thickness (h) thereof, a relationship of the following formula (1)

$$E < 0.891/\{(\alpha - \alpha s)^2 \times h\} \qquad (1)$$

where

E represents the Young's modulus (GPa) of the sealing resin at room temperature;

α represents the coefficient of linear expansion (ppm) of the sealing resin at room temperature;

αs represents the coefficient of linear expansion (3.5 ppm) of the silicon substrate; and h represents the thickness (m) of the sealing resin on a device-formed surface of the semiconductor chip.

The Young's modulus of the sealing resin can be calculated from, for example, "Nanoindenter" test data. The coefficient of linear expansion of the sealing resin can be calculated by, for example, applying the sealing resin onto a silicon substrate which has a specific Young's modulus and a specific coefficient of linear expansion with "Flexus".

The formula (1) is derived in the following manners.

Energy (G) inside the resin is expressed by the following formula (2), in the processing, for example, TCT (Temperature Cycling Test) sealing the semiconductor chip in which the multilayer interconnection structure having the interlayer insulation film with low relative dielectric constant is formed on the silicon substrate, with the sealing resin layer, and applying various kinds of thermal influences to the sealing resin layer.

$$G = \frac{1}{2} \cdot \frac{E}{(1-\nu)} \cdot \Delta\alpha^2 \cdot \Delta T^2 \cdot h \qquad (2)$$

where

G represents a elastic strain energy inside the sealing resin layer;

E represents the Young's modulus of the sealing resin [room temperature] (GPa);

ν represents Poisson's constant of the sealing resin;

Δα represents a subtraction of the coefficient of linear expansion of the sealing resin [room temperature] (α) from the coefficient of linear expansion of the silicon [room temperature] (αs: 3.5 ppm);

ΔT represents a difference of temperature from a curing of the sealing resin to the lowest cooling temperature of TCT; and h represents the thickness (m) of the sealing resin layer on a device-formed surface of the semiconductor chip.

On the basis of the formula (2) and the mechanism of the peeling of the insulation film with low relative dielectric constant in the multilayer interconnection structure, a relationship between the physical properties (Young's modulus at room temperature, coefficient of linear expansion of the sealing resin at room temperature, and thickness of the sealing resin) of the sealing resin which does not cause the peeling, and the adhesion force in the interface between the interlayer insulation films with low relative dielectric constant in the multilayer interconnection structure, satisfies the following formula (3) from the viewpoint of the fracture energy theory.

$$E < c/(\Delta\alpha^2 \cdot \Delta T^2 \cdot h) \qquad (3)$$

where

E represents the Young's modulus of the sealing resin [room temperature] (GPa);

c represents a constant;

Δα represents a subtraction of the coefficient of linear expansion of the sealing resin [room temperature] (α) from the coefficient of linear expansion of the silicon [room temperature] (αs: 3.5 ppm);

ΔT represents a difference of temperature from a curing of the sealing resin to the lowest cooling temperature of TCT; and h represents the thickness (m) of the sealing resin layer on a device-formed surface of the semiconductor chip.

Next, the formula (1) explained above is derived by fitting the peeling phenomenon of the insulation film with low relative dielectric constant in the TCT, in the semiconductor device in which the semiconductor chip is coated with actual sealing resin, in the formula (3). In the formula (3), $\Delta T^2$ can be installed into constant 0.891 of the right side of the formula (1), as a fixed value.

It is preferable that, the sealing resin layer should meet, in the coefficient of linear expansion (α) at room temperature, the Young's modulus (E) at room temperature and the thickness (h) thereof, a relationship of the following formula (4)

$$E < 0.792/\{(\alpha - \alpha s)^2 \times h\} \qquad (4)$$

where

E represents the Young's modulus (GPa) of the sealing resin at room temperature;

α represents the coefficient of linear expansion (ppm) of the sealing resin at room temperature;

αs represents the coefficient of linear expansion (3.5 ppm) of the silicon substrate; and h represents the thickness (m) of the sealing resin layer on the device-formed surface of the semiconductor chip.

As the sealing resin, for example, a resin composition of low coefficient of linear expansion which contains flexible epoxy resin and bisphenol epoxy resin or a resin composition of comparatively great coefficient of linear expansion which contains silicone rubber-based resin as its main material, can be utilized. The flexible epoxy resin is an epoxy resin which is lower in Young's modulus than orthocresol novolac epoxy resin at a heating temperature of 165° C. in the processing which applies various kinds of heat influences to the sealing resin layer, for example, the TCT. In addition, when the silicone rubber-based resin is used, it is mixed with a predetermined amount of a granular filler from the viewpoint of increase in the viscosity and adjustment of the coefficient of linear expansion in the sealing resin. As the granular filler, for example, granular silica can be used.

It is desirable that the sealing resin layer should have a thickness of 10 to 600 μm and, preferably, 100 to 500 μm. The reason is that if the sealing resin layer is too thin, the sealing resin layer having a uniform thickness cannot be formed and that if the sealing resin layer is too thick, the thermal stress caused by the sealing resin layer may be excessive.

As the interlayer insulation film with low relative dielectric constant, for example, a film having a relative dielectric constant less than 2.5 can be used. Specific examples of the film are a film having siloxane skeleton such as polysiloxane, hydrogen silsesquioxane, polymethyl siloxane, methyl silsesquioxane and the like, a film including organic resin as a main component thereof such as polyarylene ether, polybenzo oxazole, and polybenzo cyclobutene, or a porous film such as a porous silica film, a porous methyl silsesquioxane film, a porous polyarylene ether film and a porous hydrogen silsesquioxane film. Particularly, a semiconductor device according to an embodiment of the present invention, peeling and breakage of the interlayer insulation film can be effectively prevented, in the multilayer interconnection structure including a porous film having density of 2.0 g/cm$^3$ or less as the interlayer insulation film with low relative dielectric constant.

The semiconductor device according to the embodiment of the present invention will be specifically explained with reference to FIGS. 1 and 2.

FIG. 1 is a cross-sectional view showing an E-BGA (Enhanced Ball Grid Array) package. FIG. 2 is a cross-sectional view showing a semiconductor chip of FIG. 1.

A high-density multilayer interconnection board 2 having a rectangular hole 1 at its center is fixed on a metal cap 3 for heat radiation. A silicon substrate side of a semiconductor chip 4 is subjected to die bonding on the metal cap 3 exposed through the rectangular hole 1 of the high-density multilayer interconnection board 2, via a mount resin layer 5. The semiconductor chip 4 is connected to the high-density multilayer interconnection board 2 by wires 6. A sealing resin layer 7 is formed in and around the rectangular hole 1 of the high-density multilayer interconnection board 2 to cover the semiconductor chip 4 and the wires 6. The sealing resin layer 7 meets, in the coefficient of linear expansion (α) at room temperature, the Young's modulus (E) at room temperature and the thickness (h), the relationship of the following formula (1) as described above. A plurality of solder balls 8 are formed on the high-density multilayer interconnection board 2 and connected to a wiring layer on a surface of the wiring board.

Figure 2:
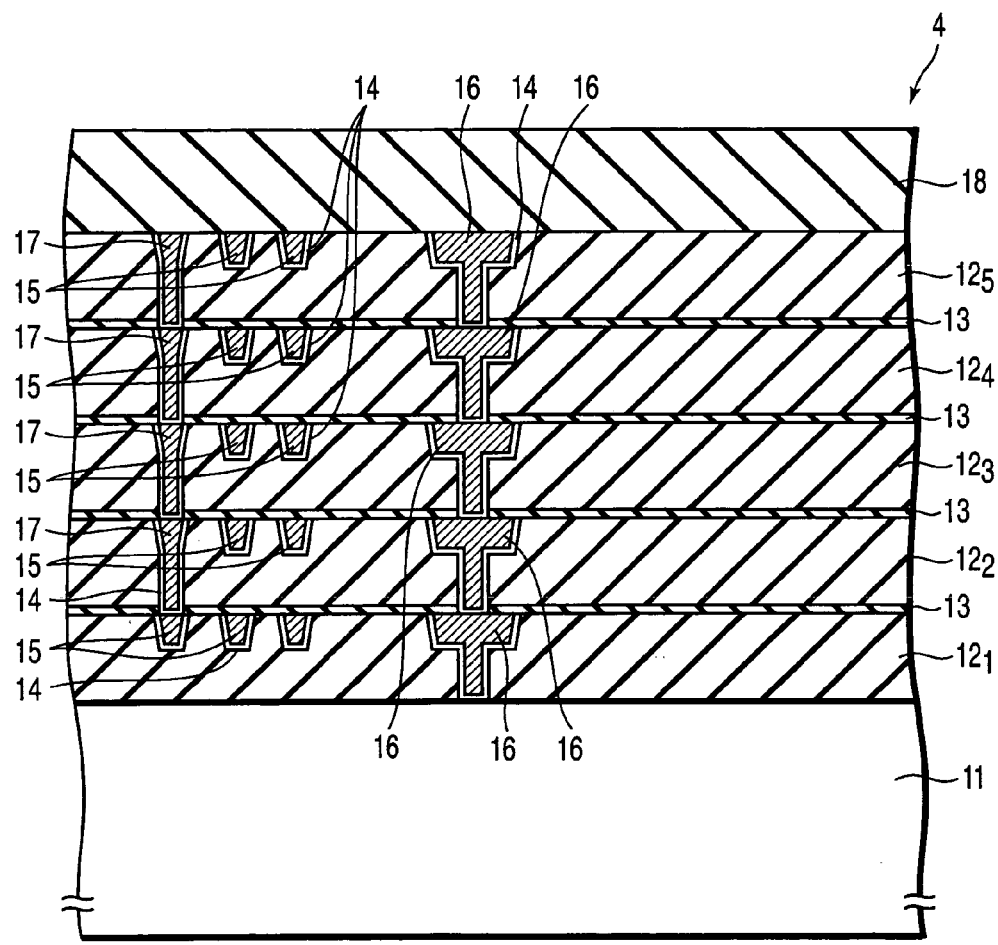
FIG. 2 shows a cross-sectional view of a semiconductor chip shown in FIG. 1.

The semiconductor chip 4 has a structure as shown in, for example, FIG. 2. First to fifth interlayer insulation films $12_1$ to $12_5$ with low relative dielectric constant are laminated on a silicon substrate 11. A etch stop film 13 formed of, for example, SiCN is provided between two of the interlayer insulation films $12_1$ to $12_5$. Wirings 15 which have a bottom surface and side surfaces covered with a barrier metal film 14 and which are formed of, for example, copper are embedded in each of the interlayer insulation films $12_1$ to $12_5$ with low relative dielectric constant. A dual damascene wiring 16 which has a bottom surface and side surfaces covered with the barrier metal film 14 and which is formed of, for example, copper is embedded in each of the interlayer insulation films $12_1$ to $12_5$ with low relative dielectric constant, such that the dual damascene wirings 16 are connected to each other. The dual damascene wiring 16 embedded in the first interlayer insulation film $12_1$ is connected to a diffusion layer (not shown) of the silicon substrate 11 or lower level wiring. A stacked via filling 17 which has a bottom surface and side surfaces covered with the barrier metal film 14 and which is formed of, for example, copper is embedded in each of the second to fifth. interlayer insulation films $12_2$ to $12_5$ with low relative dielectric constant, such that the stacked via filling 17 are connected to each other. The stacked via filling 17 embedded in the second interlayer insulation film $12_2$ is connected to the wiring 15 (left side of FIG. 2) embedded in the first interlayer insulation film $12_1$. A passivation film 18 is formed on the fifth interlayer insulation film $12_5$ including the wirings 15, the dual damascene wiring 16, and the stacked via filling 17.

The present invention cannot be applied only to the E-BGA package, but also to various kinds of packages, for example, QFP (Quad Flat Package), LQFP (Low Profile Quad Flat Package), PFBGA (Plastic Fine Pitch Ball Grid Array), Stacked PFBGA, PBGA (Plastic Ball Grid Array), FCBGA (Flip Chip Ball Grid Array), TBGA (Tape Ball Grid Array) and the like, and to a semiconductor assembly in which at least a device-formed surface of the semiconductor chip mounted on the wiring board is coated with the sealing resin layer.

According to the embodiment of the present invention, as described above, a highly-reliabe semiconductor device and/or semiconductor assembly capable of preventing the peeling and fracture of the interlayer insulation films with low relative dielectric constant without additionally using insulating resin other than the sealing resin can be provided.

That is, in the structure having the semiconductor chip in which the multilayer interconnection structure having the interlayer insulation films with low relative dielectric constant is formed on the silicon substrate, sealed with the sealing resin layer, obviously, the peeling of the interlayer insulation films with low relative dielectric constant or the interlayer insulation film with low relative dielectric constant and the other interlayer insulation film, and the fracture of the interlayer insulation films with low relative dielectric constant, result from the lower Young's modulus, the higher coefficient of linear expansion and the thicker thickness of the sealing resin layer placed in a certain thermal environment (for example, TCT). Thus, the formula (1) representing the relationship among the coefficient of linear expansion (α) at room temperature, the Young's modulus (E) at room temperature, and the thickness (h) of the sealing resin layer, are handled as indexes. The semiconductor chip is sealed with the sealing resin which has the physical properties having the relationship, i.e. the sealing resin which can reduce the thermal stress to the semiconductor chip. Therefore, a highly-reliabe semiconductor device and/or semiconductor assembly capable of preventing the peeling and fracture of the interlayer insulation films with low relative dielectric constant without additionally using insulating resin other than the sealing resin can be provided.

The embodiment of the present invention will be explained.

EXAMPLE 1 TO EXAMPLE 10

The semiconductor chip 4 is prepared by using SiOC films (low-k films) having a thickness of 400 nm and density of 1.3 g/cm$^3$ as the first to fifth interlayer insulation films $12_1$ to $12_5$ with low relative dielectric constant shown in FIG. 2, and by forming the wirings 15, the dual damascene wiring 16, and the stacked via filling 17 in each of the interlayer insulation films $12_1$ to $12_5$. The E-BGA package shown in FIG. 1 is manufactured with the semiconductor chip 4.

In the manufacturing of the E-BGA package, the sealing resin layers having a thickness of 400 μm are formed of the sealing resins (Example 1 to Example 4) in which the flexible epoxy resin and the bisphenol epoxy resin are mixed at mixture ratios of weight conversion of 60:40, 30:70, 70:30, and 20:80 and silica is also mixed at 75 wt % as the filler. The Young's modulus (E) at room temperature and the coefficient of linear expansion (α) at room temperature, of the sealing resins (Example 1 to Example 4), are shown in Table 1. The Young's modulus of the sealing resins is calculated on the basis of the "Nanoindenter" test data and the coefficient of linear expansion is calculated on the basis of the "Flexus".

In addition, in the manufacturing of the E-BGA package, the sealing resin layers having a thickness of 400 μm are formed of the sealing resins (Example 5 to Example 6) in which the granular silica serving as the filler is mixed into a high-purity silicone rubber-based resin at 65 wt % and 60 wt %. The Young's modulus (E) at room temperature and the coefficient of linear expansion (α) at room temperature, of the sealing resins (Example 5 to Example 6), are also shown in Table 1.

Moreover, in the manufacturing of the E-BGA package, the sealing resin layers having a thickness of 400 μm are formed of phenolic novolac epoxy resins which are products of Sumitomo Bakelite Co., Ltd.(Example 7 to Example 8) and a bisphenol epoxy resin which is a product of Henkel (Example 9). The sealing resins of Examples 7 and 8 are contained a deferent curing agent each other. The Young's modulus (E) at room temperature and the coefficient of linear expansion (α) at room temperature, of the sealing resins (Example 7 to Example 9), are also shown in Table 1.

Furthermore, in the manufacturing of the E-BGA package, the sealing resin layer having a thickness of 400 μm is formed of the sealing resin (Example 10) in which the granular silica is mixed into a high-purity silicone rubber-based resin at 20 wt %. The Young's modulus (E) at room temperature and the coefficient of linear expansion (α) at room temperature, of the sealing resin (Example 10), are also shown in Table 1.

The curing temperature of the sealing resins is also shown in Table 1.

TABLE 1

| | Sealing resin | | |
|---|---|---|---|
| | Young's modulus [E] (GPa) | Coefficient of linear expansion [α] (ppm) | Curing temperature (° C.) |
| Example 1 | 4.7 | 13 | 165 |
| Example 2 | 9.3 | 14 | 165 |
| Example 3 | 1.3 | 16 | 165 |

TABLE 1-continued

| | Sealing resin | | |
|---|---|---|---|
| | Young's modulus [E] (GPa) | Coefficient of linear expansion [α] (ppm) | Curing temperature (° C.) |
| Example 4 | 10.0 | 16 | 165 |
| Example 5 | 0.1 | 39 | 165 |
| Example 6 | 1.5 | 40 | 165 |
| Example 7 | 14.0 | 17 | 165 |
| Example 8 | 15.0 | 18 | 165 |
| Example 9 | 15.0 | 20 | 165 |
| Example 10 | 1.2 | 62 | 165 |

Figure 3:
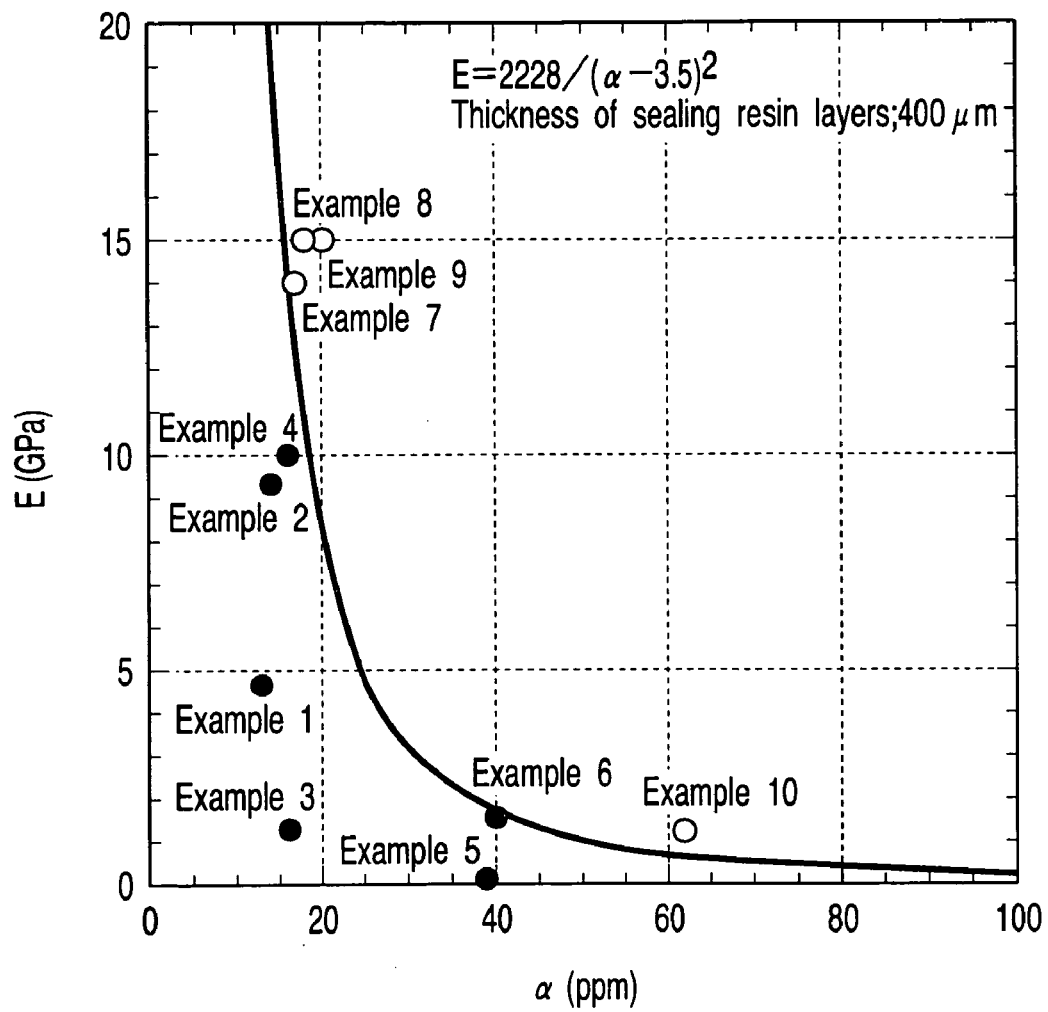
FIG. 3 shows a graph indicating peeling of a low-k film after TCT, in E-BGA packages of examples 1 to 10.

The obtained E-BGA packages of Example 1 to Example 10 have been subjected to the TCT in 300 cycles at a temperature between 165° C. and −55° C. After the test, the semiconductor chips have been taken out of the respective packages and cut in a perpendicular direction to the low-k. film (interlayer insulation film) surface to confirm the peeling of the low-k film with an ultrasonic microscope. The results of the confirmation are shown in FIG. 3. In FIG. 3, a black circle represents no peeling of the low-k film and a white circle represents peeling of the low-k film.

As evident from FIG. 3, the peeling of the low-k film of the semiconductor chip can be prevented even after the TCT has been executed in 300 cycles with the E-BGA packages of Example 1 to Example 6 wherein, in the sealing resin layers having a thickness (h) of 400 μm, the coefficient of linear expansion (α) at room temperature and the Young's modulus (E) at room temperature meet the relationship of $E<0.891/\{(\alpha-3.5)^2 \times 0.4 \times 10^{-3}\}$ ... (5) obtained by substituting h [400 μm=0.4×10$^{-3}$ (m)] and αs [coefficient of linear expansion (3.5 ppm) of the silicon substrate] into the formula (1) as described above, i.e. $E<0.891/\{(\alpha-\alpha s)^2 \times h\}$ ... (1).

On the other hand, it is understood from FIG. 3 that the peeling of the low-k film of the semiconductor chip occurs after the TCT has been executed in 300 cycles with in the E-BGA packages of Example 7 to Example 10 having the sealing resin layers in which the coefficient of linear expansion (α) at room temperature and the Young's modulus (E) at room temperature do not meet the relationship of formula (5).

That is, the peeling of the low-k film of the semiconductor chip can be prevented, in the E-BGA packages of Example 1 to Example 6 sealed with the sealing resin layers having the coefficient of linear expansion (α) at room temperature and the Young's modulus (E) at room temperature in the left area from a curve of a quadric: $E=2228/(\alpha-3.5)^2$ shown in FIG. 3, which includes E and α as variables and which is derived from the formula (5).

Figure 4:
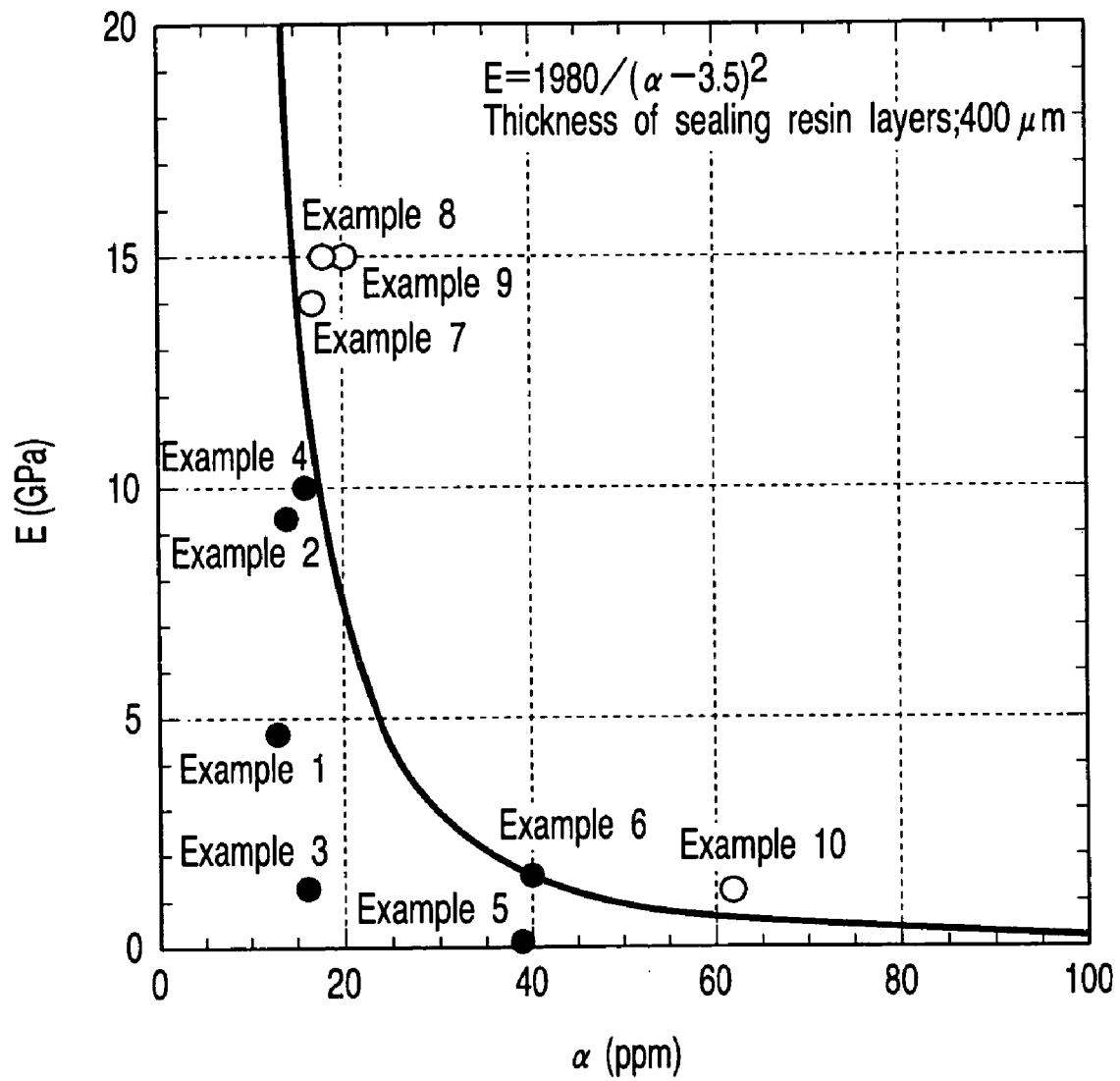
FIG. 4 shows a graph indicating peeling of the low-k film after TCT, in the E-BGA packages of examples 1 to 10, under the condition that, in the sealing resin layer, the coefficient of linear expansion (α) at room temperature and the Young's modulus (E) at room temperature meet a relationship of a more desirable formula.

In addition, by using the sealing resin layers having the coefficient of linear expansion (α) at room temperature and the Young's modulus (E) at room temperature in the left area from a curve of a quadric: $E=1980/(\alpha-3.5)^2$ shown in FIG. 4, which includes E and α as variables and which is derived from $E<0.792/\{(\alpha-3.5)^2 \times 0.4 \times 10^{31\ 3}\}$ ... (6) obtained by substituting h [400 μm=0.4×10-3 (m)] and αs [coefficient of linear expansion (3.5 ppm) of the silicon substrate] into the formula (4), i.e. $E<0.792/\{(\alpha-\alpha s)^2 \times h\}$ ... (4), the peeling of the low-k film of the semiconductor chip mounted on the E-BGA packages sealed with the sealing resin layer can be prevented more certainly.

EXAMPLE 11 TO EXAMPLE 20

In the manufacturing of the E-BGA package shown in FIG. 1, sealing resin layers having a thickness of 600 μm have been formed with ten kinds of sealing resins having the Young's modulus (E) at room temperature and the coefficient of linear expansion (α) at room temperature shown in TABLE 1.

The obtained E-BGA packages of Example 11 to Example 20 have been subjected to the TCT in 500 cycles at a temperature between 165° C. and −55° C. After the test, the semiconductor chips have been taken out of the respective packages and cut in a perpendicular direction to the low-k film (interlayer insulation film) surface to confirm the peeling of the low-k film with an ultrasonic microscope. The results of the confirmation are shown in FIG. 5. In FIG. 5, a black circle represents no occurrence of the peeling of the low-k film and a white circle represents peeling of the low-k film.

As evident from FIG. 5, the peeling of the low-k film of the semiconductor chip can be prevented even after the TCT has been executed in 500 cycles with the E-BGA packages of Example 11 to Example 13 and Example 15 wherein, in the sealing resin layers having a thickness (h) of 600 μm, the coefficient of linear expansion (α) at room temperature and the Young's modulus (E) at room temperature meet the relationship of $E < 0.891/\{(\alpha-3.5)^2 \times 0.6 \times 10^{31\ 3}\}$ ... (7) obtained by substituting h [600 μm=0.6×10⁻³ (m)] and αs [coefficient of linear expansion (3.5 ppm) of the silicon substrate] into the formula (1) as described above, i.e. $E < 0.891/\{(\alpha-\alpha s)^2 \times h\}$ ... (1). That is, the peeling of the low-k film of the semiconductor chip can be prevented, in the E-BGA packages sealed with the sealing resin layers having the coefficient of linear expansion (α) at room temperature and the Young's modulus (E) at room temperature in the left area from a curve of a quadric: $E = 1485/(\alpha-3.5)^2$ shown in FIG. 5, which includes E and α as variables and which is derived from the formula (7). In addition, if the thickness of the sealing resin layers is increased to 600 μm, the peeling occurs in the E-BGA packages (Example 4 and Example 6 of FIG. 3) in which the peeling of the low-k film is not observed when the thickness of the sealing resin layers is 400 μm. It is therefore evident that prevention of the peeling of the low-k film can be achieved by sealing the semiconductor chip with sealing resin layers in which the coefficient of linear expansion (α) at room temperature, the Young's modulus (E) at room temperature and the thickness (h), have the relationship of the formula (1) or (7).

EXAMPLE 21 TO EXAMPLE 24

In the manufacturing of the E-BGA package shown in FIG. 1, sealing resin layers having thicknesses of 10 μm, 100 μm, 400 μm, and 600 μm have been formed with the sealing resin having the Young's modulus (E) at room temperature and the coefficient of linear expansion (α) at room temperature shown in Example 8 of TABLE 1.

In the obtained E-BGA packages of Example 21 to Example 24, the peeling of the low-k film has been confirmed with an ultrasonic microscope in the same manner as that of Example 11 to Example 20. The results of the confirmation are shown below in Table 2.

TABLE 2

| | Thickness of sealing resin layer (μm) | Occurrence of peeling of low-k film |
|---|---|---|
| Example 21 | 10 | NO |
| Example 22 | 100 | NO |
| Example 23 | 400 | YES |
| Example 24 | 600 | YES |

As evident from Table 2, the peeling of the low-k film of the semiconductor chip can be prevented even after the TCT has been executed in 500 cycles with the E-BGA packages of Example 21 and Example 22 in which the sealing resin layers have thinner thicknesses, i.e. 10 μm and 100 μm. In other words, the peeling of the low-k film occurs in the E-BGA packages of Example 23 and Example 24 having the sealing resin layers which have thicknesses of 400 μm and 600 μm. However, the peeling of the low-k film of the semiconductor chip can be prevented, in the E-BGA packages of Example 21 and Example 22 having the sealing resin layers which are thinner to 100 μm or smaller.

It is therefore evident that prevention of the peeling of the low-k film can be achieved by sealing the semiconductor chip with the sealing resin layers in which the coefficient of linear expansion (α) at room temperature, the Young's modulus (E) at room temperature and the thickness (h) have the relationship of the formula (1).

Additional advantages and modifications will readily occur to those skilled in the art. Therefore, the invention in its broader aspects is not limited to the specific details and representative embodiments shown and described herein. Accordingly, various kinds of modifications may be made without departing from the spirit or scope of the general inventive concept as defined by the appended claims and their equivalents.

What is claimed is:

1. A semiconductor device comprising:
   a semiconductor chip in which a multilayer interconnection is formed on a silicon substrate and includes a dual damascene interconnection formed of copper embedded in an interlayer insulation film with a low relative dielectric constant through a barrier metal film; and
   a sealing resin layer which coats the semiconductor chip, wherein, the sealing resin layer meets, in coefficient of linear expansion (α) at room temperature, Young's modulus (E) at room temperature and thickness (h) thereof, a relationship of the following formula (1)

$$E < 0.891/\{(\alpha-\alpha s)^2 \times h\} \quad (1)$$

where
   E represents the Young's modulus (GPa) of the sealing resin at room temperature;
   α represents the coefficient of linear expansion (ppm) of the sealing resin at room temperature;
   αs represents the coefficient of linear expansion (3.5 ppm) of the silicon substrate; and
   h represents the thickness (m) of the sealing resin on the device-formed surface of the semiconductor chip.

2. A semiconductor device according to claim 1, wherein, the sealing resin layer meets, in coefficient of linear expansion (α) at room temperature, Young's modulus (E) at room temperature and thickness (h) thereof, a relationship of the following formula (4)

$$E < 0.792/\{(\alpha-\alpha s)^2 \times h\} \quad (4)$$

where
E represents the Young's modulus (GPa) of the sealing resin at room temperature;
α represents the coefficient of linear expansion (ppm) of the sealing resin at room temperature;
αs represents the coefficient of linear expansion (3.5 ppm) of the silicon substrate; and
h represents the thickness (m) of the sealing resin on the device-formed surface of the semiconductor chip.

3. A semiconductor device according to claim 1, wherein the interlayer insulation film with the low relative dielectric constant has the relative dielectric constant of less than 2.5.

4. A semiconductor device according to claim 1, wherein the interlayer insulation film with the low relative dielectric constant has density of 2.0 g/cm³ or less.

5. A semiconductor device according to claim 3, wherein the interlayer insulation film with the low relative dielectric constant is a film having siloxane skeleton selected from the group of polysiloxane, hydrogen silsesquioxane, polymethyl siloxane and methyl silsesquioxane, a film including organic resin as a main component thereof selected from the group of polyarylene ether, polybenzo oxazole and polybenzo cyclobutene, or a porous film selected from the group of a porous silica film, a porous methyl silsesquioxane film, a porous polyarylene ether film and a porous hydrogen silsesquioxane film.

6. A semiconductor device according to claim 1, wherein the sealing resin layer has a thickness of 10 to 600 μm.

7. A semiconductor device according to claim 1, wherein the sealing resin layer has a thickness of 100 to 500 μm.

8. A semiconductor assembly comprising:
a wiring board;
a semiconductor chip which is mounted on the wiring board and in which a multilayer interconnection is formed on a silicon substrate and includes a dual damascene interconnection formed of copper embedded in an interlayer insulation film with a low relative dielectric constant through a barrier metal film; and
a sealing resin layer which covers at least a device-formed surface of the semiconductor chip,
wherein, the sealing resin layer meets, in coefficient of linear expansion (α) at room temperature, Young's modulus (E) at room temperature and thickness (h) thereof, a relationship of the following formula (1)

$$E<0.891/\{(\alpha-\alpha s)^2 \times h\} \quad (1)$$

where
E represents the Young's modulus (GPa) of the sealing resin at room temperature;
α represents the coefficient of linear expansion (ppm) of the sealing resin at room temperature;
αs represents the coefficient of linear expansion (3.5 ppm) of the silicon substrate; and
h represents the thickness (m) of the sealing resin on the device-formed surface of the semiconductor chip.

9. A semiconductor assembly according to claim 12, wherein, the sealing resin layer meets, in coefficient of linear expansion (α) at room temperature, Young's modulus (E) at room temperature and thickness (h) thereof, a relationship of the following formula (4)

$$E<0.792/\{(\alpha-\alpha s)^2 \times h\} \quad (4)$$

where
E represents the Young's modulus (GPa) of the sealing resin at room temperature;
α represents the coefficient of linear expansion (ppm) of the sealing resin at room temperature;
αs represents the coefficient of linear expansion (3.5 ppm) of the silicon substrate; and
h represents the thickness (m) of the sealing resin on the device-formed surface of the semiconductor chip.

10. A semiconductor assembly according to claim 12, wherein the interlayer insulation film with the low relative dielectric constant has the relative dielectric constant of less than 2.5.

11. A semiconductor assembly according to claim 12, wherein the interlayer insulation film with the low relative dielectric constant has density of 2.0 g/cm³ or less.

12. A semiconductor assembly according to claim 14, wherein the interlayer insulation film with the low relative dielectric constant is a film having siloxane skeleton selected from the group of polysiloxane, hydrogen silsesquioxane, polymethyl siloxane and methyl silsesquioxane, a film including organic resin as a main component thereof selected from the group of polyarylene ether, polybenzo oxazole and polybenzo cyclobutene, or a porous film selected from the group of a porous silica film, a porous methyl silsesquioxane film, a porous polyarylene ether film and a porous hydrogen silsesquioxane film.

13. A semiconductor assembly according to claim 12, wherein the sealing resin layer has a thickness of 10 to 600 μm.

14. A semiconductor assembly according to claim 12, wherein the sealing resin has a composition including flexible epoxy resin and bisphenol epoxy resin.

15. A semiconductor assembly according to claim 12, wherein the sealing resin has a composition in which a granular filler is mixed into silicone rubber-based resin.

16. A semiconductor device comprising:
a semiconductor chip in which a multilayer interconnection structure having an interlayer insulation film with a low relative dielectric constant is formed on a silicon substrate; and
a sealing resin layer which coats the semiconductor chip, and comprising a composition including flexible epoxy resin and bisphenol epoxy resin mixed at mixture ratios by weight of 20:80 to 70:30,
wherein, the sealing resin layer meets, in coefficient of linear expansion (β) at room temperature, Young's modulus (E) at room temperature and thickness (b) thereof, a relationship of the following formula (1)

$$E>0.891/\{(\beta-\beta s)^2 \times h\} \quad (1)$$

where
E represents the Young's modulus (GPa) of the sealing resin at room temperature;
β represents the coefficient of linear expansion (ppm) of the sealing resin at room temperature;
βs represents the coefficient of linear expansion (3.5 ppm) of the silicon substrate; and
h represents the thickness (m) of the sealing resin on the device-formed surface of the semiconductor chip.

17. A semiconductor device comprising:
a semiconductor chip in which a multilayer interconnection structure having an interlayer insulation film with a low relative dielectric constant is formed on a silicon substrate; and
a sealing resin layer which coats the semiconductor chip, composition in which a granular filler is mixed into silicone rubber-based resin,
wherein, the sealing resin layer meets, in coefficient of linear expansion (β) at room temperature, Young's modulus (E) at room temperature and thickness (h) thereof, a relationship of the following formula (1)

$$E > 0.891 / \{(\beta - \beta s)^2 \times h\{ \quad (1)$$

where

E represents the Young's modulus (GPa) of the sealing resin at room temperature;

β represents the coefficient of linear expansion (ppm) of the sealing resin at room temperature;

βs represents the coefficient of linear expansion (3.5 ppm) of the silicon substrate; and h represents the thickness (m) of the sealing resin on the device-formed surface of the semiconductor chip.

* * * * *

UNITED STATES PATENT AND TRADEMARK OFFICE
CERTIFICATE OF CORRECTION

PATENT NO. : 7,095,124 B2  
APPLICATION NO. : 10/975071  
DATED : August 22, 2006  
INVENTOR(S) : Hasunuma et al.

Page 1 of 1

It is certified that error appears in the above-identified patent and that said Letters Patent is hereby corrected as shown below:

Claim 9, column 11, line 56, change "claim 12," to --claim 8,--.

Claim 10, column 12, line 5, change "claim 12," to --claim 8,--.

Claim 11, column 12, line 9, change "claim 12," to --claim 8,--.

Claim 12, column 12, line 12, change "claim 14," to --claim 10,--.

Claim 13, column 12, line 23, change "claim 12," to --claim 8,--.

Claim 14, column 12, line 27, change "claim 12," to --claim 8,--.

Claim 15, column 12, line 30, change "claim 12," to --claim 8,--.

Claim 16, column 12, line 43, change "($\beta$)" to --($\alpha$)--.

Claim 16, column 12, line 47, change "$E>0.891/\{(\beta-\beta s)^2 xh\}$" to --$E<0.891/\{(\alpha-\alpha s)^2 xh\}$--.

Claim 16, column 12, line 51, change "$\beta$represents" to --$\alpha$ represents--.

Claim 16, column 12, line 53, change "$\beta s$ represents" to --$\alpha s$ represents--.

Claim 17, column 12, line 67, change "($\beta$)" to --($\alpha$)--.

Claim 17, column 13, line 3, change "$E>0.891/\{(\beta-\beta s)^2 xh\{$" to --$E<0.891/\{(\alpha-\alpha s)^2 xh\}$--.

Claim 17, column 14, line 1, change "($\beta$represents" to --$\alpha$ represents--.

Claim 17, column 14, line 3, change "($\beta s$ represents" to --$\alpha$ represents--.

Signed and Sealed this

Twelfth Day of December, 2006

JON W. DUDAS  
*Director of the United States Patent and Trademark Office*